310-335
11/16/82
OR 4,359,659
SR

United States Patent [19]
Phillips

[11] 4,359,659
[45] Nov. 16, 1982

[54] PIEZOELECTRIC SHOCK WAVE DETECTOR

[75] Inventor: Robert B. Phillips, Hants, England

[73] Assignee: Australasian Training Aids (Pty.) Limited, Albury, Australia

[21] Appl. No.: 123,477

[22] Filed: Feb. 21, 1980

[30] Foreign Application Priority Data

Feb. 27, 1979 [GB] United Kingdom ................. 7906920

[51] Int. Cl.$^{3}$ ................................ H01L 41/08

[52] U.S. Cl. ................................ 310/335; 310/326

[58] Field of Search ............... 310/322, 334, 335, 327, 310/326

[56] References Cited

U.S. PATENT DOCUMENTS

| | | | |
|---|---|---|---|
| 2,480,535 | 3/1947 | Alois et al. | 310/345 X |
| 3,233,213 | 2/1966 | Harris | 340/8 R |
| 3,278,771 | 10/1966 | Fry | 310/335 |
| 3,387,604 | 6/1968 | Erikson | 310/335 X |
| 3,470,395 | 9/1969 | Moffatt | 310/335 X |
| 3,501,654 | 3/1970 | Humphries | 310/339 X |
| 3,517,226 | 6/1970 | Jones, Sr. | 310/335 |
| 3,710,151 | 1/1973 | Massa et al. | |
| 3,979,565 | 9/1976 | McShane | 179/110 A |
| 3,990,035 | 11/1976 | Byers | 340/8 R |
| 4,217,516 | 8/1980 | Iinuma et al. | 310/335 |

FOREIGN PATENT DOCUMENTS

| | | | |
|---|---|---|---|
| 964136 | 1/1950 | France . | |
| 2311300 | 12/1976 | France . | |
| 198797 | 6/1967 | U.S.S.R. | 310/335 |

OTHER PUBLICATIONS

Specific Purpose Transducers in PZT Ceramics, Vernitron Ltd. Bulletin No. 66047/A, Jan. 1975, (Southampton, England).

IBM Technical Disclosure Bulletin, vol. 21, No. 9, Feb. 1979.

*Primary Examiner*—Mark O. Budd
*Attorney, Agent, or Firm*—Schwartz, Jeffery, Schwaab, Mack, Blumenthal & Koch

[57] ABSTRACT

Transducer assembly having a head and a transducer element contacting the rear of the head.

In order to provide an output signal from the transducer element which has a positive value over a wide range of angles of incidence of shock or pressure waves to be detected by said transducer assembly, the transducer element contacts with the rear of the head over a zone which is smaller in cross sectional area taken perpendicular to the direction of propagation of the shock or pressure wave through the assembly than that of the rear of the head. In order to provide electrical connection to the front face of the transducer element which can be a piezo-electric element, it can be mounted in a metal tube with a partly closed end which electrically contacts the front face of the element. In order to positively position the transducer assembly and to inhibit unwanted shock or pressure waves reaching the element, the assembly has a series path of four interfaces of acoustic mismatch of shock or pressure waves, between said head and a body.

19 Claims, 4 Drawing Figures

PIEZOELECTRIC SHOCK WAVE DETECTOR

FIELD OF THE INVENTION

The present invention relates to transducer assemblies and more particularly to transducer assemblies adapted to detect air-borne pressure or shock waves generated, for example, by supersonic projectiles such as bullets.

DESCRIPTION OF PRIOR ART

It has been proposed to provide an apparatus for determining the position of the trajectory of a bullet or similar supersonic projectile fired at a target, the apparatus comprising a number of transducer assemblies located in a row beneath a target at which the bullet or projectile is fired, the transducers being adapted to detect the conical shock or pressure wave generated by the bullet or other projectile. The precise instants of reception of the pressure or shock wave by each transducer assembly is recorded, and from the time differences between the instants of reception of the pressure or shock waves by the various transducer assemblies it is possible to calculate information concerning the trajectory of the bullet. It has been proposed that a plurality of transducer assemblies be associated with each target of a target shotting range, the transducer assemblies being associated with timing means adapted to time the time delays between the instants or reception of the pressure or shock wave generated by a bullet or projectile by the various transducer assemblies, signals representative of the time delays being supplied to a computer adapted to calculate the position at which the bullet impinged on or passed by the target. The computer controls a visual display unit to display a representation of the target and an indication of where the bullets hit the target or passed by the target. Examples of such systems are disclosed in our co-pending U.K. patent applications Nos. 7253/77 and 79174942. Sophistications to this system have also been proposed, for example in our co-pending European Patent application No. 79302820.0.

It will be appreciated that each transducer assembly must be able to detect a pressure or shock wave falling over wide angles of incidence and be able to generate a signal precisely at the instant the shock wave is received, or after a constant time delay after such instant. Also each transducer assembly must be able to detect accurately the pressure, or shock wave generated by the bullet or other projectile so that the apparatus is not actuated by any stray "noise". In some of the prior art transducer assemblies, the actual transducer signal output is zero when the shock or pressure wave is received at certain angles of incidence. At other angles the sign of the signal changes from say positive to negative, therefore a false position is calculated by the computer when this occurs. Further it is of paramount importance in some applications to precisely locate the position of the transducer assemblies so that exacting calculations can be made as to the position of passing of a projectile. In this context it has been found that each transducer assembly needs to be accurately located and that if they are firmly fastened to a frame of the target apparatus, then mechanical vibrations generated in the frame of the apparatus, consequent on the striking of the target with a projectile, pass to the transducer element and interfere with the detection signals. It should be realized that the transducer assemblies are looking for the air-borne shock or pressure wave generated on the passing of a projectile and not some secondary shock wave transmitted through the frame of the apparatus. In the aforementioned U.K. Patent Specifications we disclose mounting the transducers in a vibration isolating medium such as in a resin. Such isolation of the mechanical vibration is fairly satisfactory, however, for certain applications such isolation does not permit extremely positive location of the transducer assemblies to be obtained. This is because each of the transducer assemblies, moves within the vibration isolating medium consequent on the mechanical vibrations in the frame generated by the shock wave of the bullet, impinging on the frame or any other part of the target or by the target frame being hit by a bullet.

SUMMARY OF THE INVENTION

Accordingly, it is an object of the present invention to provide an improved transducer assembly. Therefore according to one aspect of the present invention there is provided a shock or pressure wave detecting transducer assembly for detecting air-borne shock or pressure waves generated on movement of a projectile there past, said transducer comprising, a head, said head being substantially acoustically solid and substantially acoustically rigid and having a front surface to receive shock or pressure waves received over a wide range of angles of incidence relative to the transducer assembly and to transmit them to a point on the rear face characterized by;

a transducer element mounted behind said head and connected with the rear face of the head by a zone which embraces said point, said zone being substantially smaller in cross sectional area measured perpendicular to the propagation direction through said zone than that of said rear face, the element being responsive to those pressure or shock waves which propagate through said zone, whereby to provide polar response signal outputs from said element which have the same signal polarity and do not have a zero value over said wide range of the angles of incidence.

According to a further aspect of the present invention there is provided a shock or pressure wave detecting transducer assembly for detecting air-borne shock or pressure waves generated on movement of a projectile therepast, said transducer comprising a head for receiving said shock or pressure waves and a transducer element mounted behind said head and connected with the rear face thereof;

said head and said transducer element being mounted by mounting means on a body which is used for fastening said transducer assembly to frame means characterized by;

said mounting means including at least four interfaces between said head and said body which define a series path of acoustic mismatches of shock or pressure waves, whereby to enhance isolation of frame borne shock or pressure waves from said head whilst permitting high stability of the position of mounting of said transducer assembly to said frame.

According to an even further aspect of the present invention there is provided a shock or pressure wave detecting transducer assembly for detecting air-borne shock or pressure waves on movement of a projectile therepast, said transducer comprising a head, said head being substantially acoustically solid and substantially acoustically rigid and having a front surface to receive shock or pressure waves received over a wide range of angles of incidence relative to the transducer assembly and to transmit them to a point on the rear face thereof, a transducer element comprising a piezo-electric member connected with said rear face by a spigot which embraces said point, said spigot being substantially smaller in cross sectional area measured perpendicular to the direction of propagation direction of shock or pressure waves through said spigot than that of said rear face characterized by;

said piezo-electric member being mounted within an electrically conductive tube which has a partly closed end, said piezo-electric number being mounted at said partly closed end so that one face of said piezo-electric member electrically connects with said partly closed end and wherein said spigot connects with said one face of said piezo-electric member through an opening in said partly closed end whereby electrical connection to said one face can be obtained by taking a lead from the other end of said tube.

DETAILED DESCRIPTION OF THE INVENTION

Figure 1:
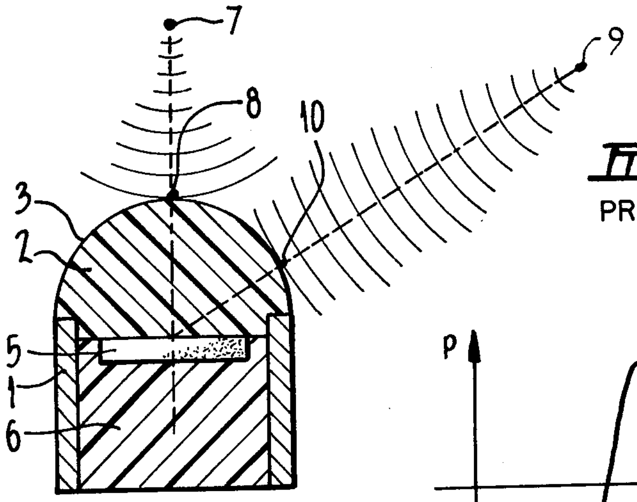
FIG. 1. PRIOR ART
FIG. 1 is a cross sectional view of a prior proposed transducer for use in a target range equipment as described above.

Referring now to the accompanying drawings, FIG. 1 illustrates a prior proposed type of transducer assembly which comprises a tubular metal sleeve 1 and a dome-shaped head 2 mounted on the upper end of the sleeve 1, the dome-shaped head 2 having a substantially hemispherical upper surface 3 and a lower cylindrical portion 4 which protrudes into the tubular member 1. A block of piezo-electric material 5 is in contact with the lower face of the portion 4 and is embedded in a block of a setting compound, such as epoxy resin. Thus, in manufacturing the transducer assembly illustrated in FIG. 1 the dome-shaped head is formed, for example, of metal and is mounted in position at the end of the tubular member 1, the piezo-electric block 5 is located in position and subsequently a setting compound, such as an epoxy resin is introduced into the tube, which first is placed in an inverted position to that in FIG. 1, and is permitted to set to form the block 6. Appropriate electrical leads extend from the piezo-electric block 5 to an amplifier and an appropriate timing device.

A plurality of transducer assemblies as illustrated in FIG. 1 may be located in front of a target to detect air-borne shock or pressure waves generated by bullets fired at the target. If a bullet passes along a flight path 7 located immediately above the head 2 of the transducer assembly the conically expanding shock wave generated on movement of the bullet through air will impinge on the head 2 at a point 8 which is located substantially above the piezo-electric block 5 and along the central axis of the transducer. Thus, the angle of incidence of the shock wave relative to the central axis will be 0°. On the other hand, if a bullet or other projectile follows flight path 9 the conically expanding pressure or shock wave will impinge on the head 2 at the point 10, and thus will subtend an angle of approximately 60° to the central axis.

Figure 2:
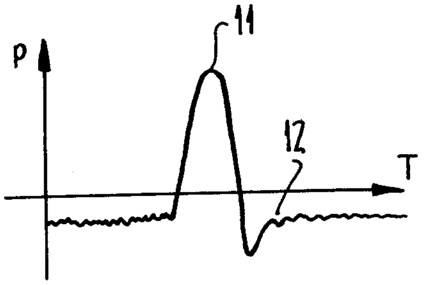
FIG. 2 is a graphical representation of air pressure at a point near a trajectory of a bullet plotted against time showing the sharp rise in air pressure that is experienced when the air-borne pressure or shock wave generated by the bullet passes the point.

If air pressure at a point adjacent the trajectory of a projectile or bullet is considered with regard to time, see FIG. 2, it will be noted that the pressure is substantially constant, the minor fluctuations in pressure being as a result of amplifier background noise or general ambient noise. As the pressure or shock wave is detected, air pressure rises rapidly to form the peak 11 illustrated in FIG. 2, and eventually the air pressure returns to the ambient pressure, as shown at 12, again with minor fluctuations due to ambient noise.

Figure 3:
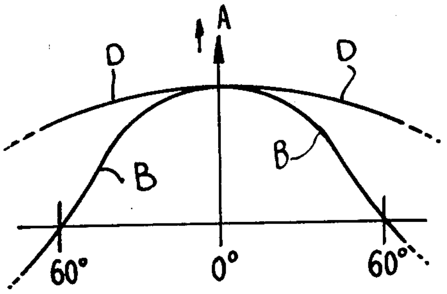
FIG. 3 is a graphical figure showing the amplitude of output signals generated by the transducer shown in FIG. 1 with reference to the angle of incidence of the pressure or shock wave falling on the dome-shaped head of the transducer assembly.

It has been found experimentally that the amplitude of the output signal of a transducer assembly as illustrated in FIG. 1 varies with regard to the angle of incidence of the shock or pressure wave on the dome-shaped head 2. If all other factors are constant, the amplitude of the output signal of the transducer is at a maximum where the pressure or shock waves subtends no angle with the central axis of the transducer, falls to substantially zero when the subtended angle is just less than 60° and is negative when the subtended angle is more than 60°. This is illustrated by curve B of FIG. 3 of the accompanying drawings. Thus it will be appreciated that where a positive-going electrical pulse is generated by the piezo-electric block 5 when the bullet passes immediately over the transducer assembly, a negative going pulse will be generated when a bullet or other projectile passes adjacent the assembly but subtends an angle of more than 60°. It will be appreciated that this can cause major problems in connection with the timing of the precise instant of reception of the pulse by the transducer assembly, since the pulse to be detected may have positive-going or negative-going characteristics and at the critical angle of just less than 60° the pulse will have virtually no amplitude. Moreover the transducer assembly is required to receive the shock or pressure wave over a wide range of angles of incidence of approximately up to 80° on both sides of the central axis. Therefore for the purposes of this specification the term 'wide range' means up to that angle of incidence.

In the known transducer assemblies they have been fastened to a rigid frame member of a target and hitherto they have been held in a resilient vibration de-coupling medium which in turn is clamped to the frame. A problem with such mounting is that the decoupling material is resilient and accordingly the transducer can move relative to the frame if the frame vibrates. This, in turn, effects the accuracy of any calculations as to the position of the bullet.

We have found that if the transducer is mounted by supporting means which has a series path of acoustically different vibration transmitting materials with at least four interfaces of mismatch between the frame and the transducer head, then this problem can be overcome.

Further, in the known transducer assemblies, piezo-electric discs have been used as the transducer elements and it has been a problem with regard to cost and time of manufacture, to provide an electrical connection with the front face thereof in order to extract the generated electrical signal therefrom. We have overcome this problem by mounting the piezo-electric transducer element at one end of an electrically conductive metal tube, and wherein that end is partly closed so that the metal closing the end can make good electrical contact with the front face of the piezo electric disc. The electrical lead normally connected to the front face of the disc can then be connected to the rear end of the tube.

Figure 4:
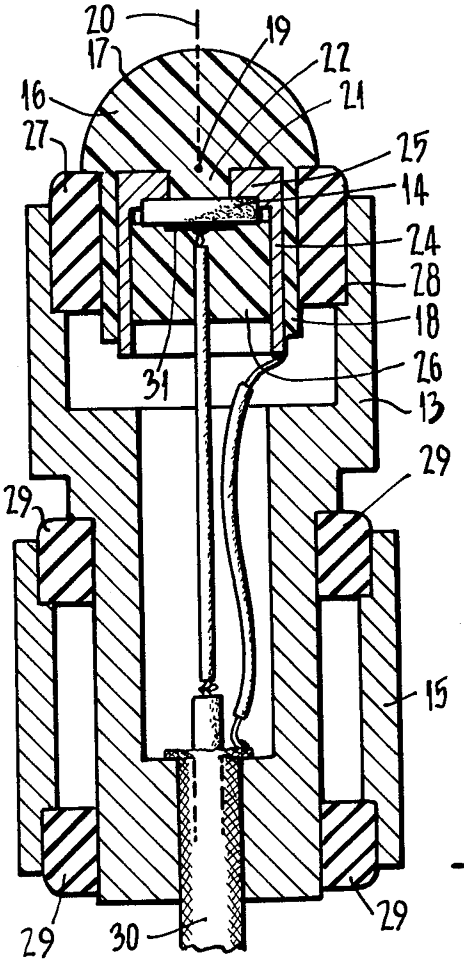
FIG. 4 is a cross-sectional view of one embodiment of a transducer in accordance with the present invention.

FIG. 4 of the accompanying drawings shows one preferred embodiment of transducer assembly incorporating all three features referred to above.

The transducer assembly comprises a main body 13 of circular cross section and being of generally cup shape. The body 13 is made from a free cutting brass material. The open end of the cup shaped body 13 has a transducer element 14 fitted therein. The lowermost end of the body has an opening therein through which a coaxial cable can pass to make electrical connection with the transducer element 14. The main body part 13 has an outer body part 15 fitted at the lowermost end thereof. The outer body part 15 is used for rigidly clamping the transducer assembly to a frame of the target apparatus.

The transducer assembly has a head 16 which has a hemispherical front outer surface 17. The head 16 is circular in cross section and has a rearwardly extending tubular portion 18. The transducer element 14 is mounted within the tubular portion 18. The head 16 is made from a resin material such as type M with hardener type MY956 available from Ciba-Geigy Limited Ducksford, Cambridge, England. The head 16 is therefore substantially acoustically solid and substantially acoustically rigid and the hemispherical surface 17 is shaped so as to allow shock or pressure waves which strike the surface 17 to propagate to a point 19 at approximately the centre of the hemispherical surface 17 with substantially the same time of propagation irrespective of the angle of reception of the shock or pressure wave on the surface 17. Thus, the head can transmit shock or pressure waves received over wide angles of incidence to the central axis 20 of the transducer assembly, to the point 19 with substantially the same propagation time. The rear surface 21 of the head 16 has a zone defined by a spigot 22 extending rearwardly therefrom. The spigot 22 is of a substantially smaller cross sectional area, taken perpendicular to the direction of propagation of shock or pressure waves axially through the transducer assembly, than that of the rear surface 21 of the head 16 across the whole of the diameter of the head. A piezo electric disc 14 type MB1043 available from Mullard Ltd, Torrington Place, London, England is held in mating face engagement with the spigot 22 rear surface. The piezo-electric disc 14 is retained in a sleeve 24 manufactured of free cutting brass and the sleeve 24 has a closed end 25 with a central opening therein sufficient to enable the spigot 22 to pass therethrough and contact with the front face of the piezo-electric disc 14. The disc 14 is, in turn, held within the sleeve 24 with a back fill of resin 26 of the same material as the head 16. The sleeve 24 is in turn rigidly held within the sleeve portion 18 of the head 16 with a thin film of resin material acting as a glue between the head 16 and the sleeve 24. The resin is of the same material as that of the head 16. The head 16 is supported in the body 13 by an annular ring 27 of epoxy such as type 3110 R.T.V. encapsulant and type S.R.T.V. catalyst available from Dow Corning Corp., Midland, Michigan, U.S.A. The annular ring 27 is a tight frictional fit around the outside of the tubular portion 18 of the head 16 and also in an internal stepped portion 28 of the body 1. Thus the head 16 is retained to the body 13 by tight frictional engagement.

The body 13 is in turn, supported in the outer body 15 by two further annular rings 29 of the same epoxy as that of ring 27.

The coaxial cable 30 passes through an opening in the bottom of the main body 13 and the inner cable thereof is connected to the rear face of the piezo-electric element 14 and bonded thereto with a conductive epoxy 31. Such as type 3021 available from Acme Chemicals & Insulation Co., New Haven, Conn. U.S.A. The bonding of the central leads with the epoxy 31 is effected prior to providing the back fill 26. The outer braid of the coaxial cable 30 is in turn, connected with the rear of the sleeve 24 by a lead as by soldering thereto. Thus, electrical connection is made to both faces of the piezo-electric disc 14.

In use, the outer body part 15 is held to a frame of the target apparatus be being clamped rigidly in a clamp member which, in turn, is screwed to the frame. The transducer assembly is arranged with its central axis 20 pointing upwardly so that the hemispherical surface 17 can receive shock or pressure waves from passing bullets. The transducer assembly operates by the shockwaves being detected on the hemispherical surface 17 and propagating to point 19 with a substantially constant propagation time delay irrespective of the angle of incidence over said wide range relative to the central axis 20. The shock or pressure waves which propagate through the head 16 then pass through the zone or spigot 22 to the transducer element 14. In the embodiments shown the spigot 22 is of smaller cross section area than the planar cross sectional area of the circular transducer 14 both areas being perpendicular to the propagation direction of the shock or pressure waves through the zone or spigot 22. Thus, the zone or spigot 22 is of substantially smaller area than the cross sectional area of the rear surface 21 of the head 16 and also substantially smaller than the corresponding cross section of the transducer 14. The output of the transducer element 14 is substantially as shown in curve D of FIG. 3 irrespective of the angle of incidence of the shock or pressure waves received over said wide angle relative to the central axis 20. Moreover, there are at least four interfaces between the outer body part 15 of the transducer assembly and the head 16. Such interfaces occur between the outer housing part 15 and the annular ring 29, between the annular ring 29 and the main body 13, between the main body 13 and the annular ring 27 and between the annular ring 27 and the head 16. With such a construction there are four interfaces where there is a change of acoustic impedance and as a result any shock waves induced in the frame of the target apparatus are inhibited from passing to the head 16 as at each interface there is a reflection of the transmitted shock or pressure waves rather than a transmission and by the time any such pressure waves reach the head 16 their magnitude is substantially negligable.

In addition with the construction shown, a relatively simple means is provided for making electrical connection to the front face of the transducer element 14 such that assembly of the transducer is more simple than with known prior art transducers.

It will be appreciated that many modifications may be made to the present invention as for example instead of the head 16 being made of a resinous material it may be made from any material suitable for conducting shock or pressure waves. One such material is aluminum. Further, the head 16 may not be hemispherical in shape but may be slightly domed, the exact shape of the surface 17 thereof being determined by the requirement of having all the shock or pressure waves induced in the head transmitted to a point such as point 19 with substantially the same propagation time delay. Thus, for example by filing portions off the hemispherical surface so as to flatten it somewhat, it may be possible to tune the actual head 16 to ensure that shock waves reach the point 19 with precisely the same propagation time delay period irrespective of the angle of incidence over side wide ranges. Further, the head 16 may be disc like rather than hemispherical such that the upper surface 17 is still circular about a point, such as point 19 whereby the actual transducer head 16 is arranged for detecting shock or pressure waves which arrive only in two dimensions rather than in three dimensions as will be provided by the hemispherical surface 17 of the embodiment described above. The disc like head can be obtained by cutting vertically downwardly into a domed shaped head to remove portions at the front and rear to leave a planar vertical section with a circular hit surface defined by portion of the original hemispherical surface 17. In all other respects the transducer assembly will be of identical construction to that shown.

It will also be appreciated that many types of transducer elements 14 can be incorporated. For example, all transducer elements which are generally planar in nature and which have an output signal generated therein consequent on being flexed or moved out of that plane are quite suitable. Examples of these would be capacitive transducers and strain gauge transducers. Moreover, it is possible to incorporate a magnetically operated transducer such as one which has a coil member and a relatively movable magnetic member therein as by connection of the movable member thereof with the zone or spigot 22.

Further, it is possible to provide the zone or spigot 22 at some point other than at the central axis 20 on the rear surface 21. For example, it is possible to have an annular extension extending from the rear face 21. Such extension will then comprise the zone 22. Alternatively, it is possible to provide a zone or spigot 22 offset to one side of the central axis 20. Such an alternative embodiment is particularly useful where the axis 20 is arranged in use to be generally horizontal and wherein the shock or pressure waves strike the surface 17 on the side of the central axis 20 as the zone or spigot 22 is located.

Typical dimensions of the transducer assembly shown in FIG. 4 are the outer body part 15 being approximately 17 millimeters in diameter and having a length of 14 millimeters. The outer diameter of the main body 13 being approximately 15 millimeters and having a length of approximately 26 millimeters. FIG. 4 has been drawn approximately to scale and accordingly, the sizes of the other components can be readily ascertained.

I claim:

1. A shock or pressure wave detecting transducer assembly for detecting air-borne shock or pressure waves generated on movement of a projectile therepast, said transducer comprising, a head, said head having a front surface to receive shock or pressure waves received over a wide range of angles of incidence of up to approximately 80° with respect to a central axis of the transducer assembly and to transmit them to a point on the rear face, characterized by;

a transducer element mounted behind said head and connected with the rear face of the head by a zone which embraces said point, said zone being substantially smaller in cross sectional area measured perpendicular to the propagation direction through said zone than that of said rear face, the element being responsive to those pressure or shock waves which propagate through said zone, said zone comprising a means for providing polar response signal outputs from said element, said outputs having the same signal polarity and do not have a zero value over said wide range of the angles of incidence.

2. A shock or pressure wave detecting transducer assembly as claimed in claim 1 wherein said zone is defined by a member which extends from said rear face of the head.

3. A transducer assembly as claimed in claim 2 wherein said transducer element is of the type which is generally planar and provides a signal output on being flexed out of its plane and wherein said transducer element has a greater cross-sectional area measured perpendicular to said propagation direction than that of said member.

4. A transducer assembly as claimed in claim 2 wherein said transducer element is a piezo-electric element.

5. A transducer assembly as claimed in claim 1 wherein said zone is a spigot extending from the rear face of said head.

6. A shock or pressure wave detecting transducer assembly for detecting air-borne shock or pressure waves generated on movement of a projectile therepast, said transducer comprising, a head, said head having a hemispherical front surface to receive shock or pressure waves received over a wide range of angles of incidence of up to approximately 80° with respect to a central axis of the transducer assembly and to transmit them to a point on the rear face, which is at the centre of said hemispherical front surface characterized by;

a transducer element mounted behind said head and connected with the rear face of the head by a zone which embraces said point, said zone being substantially smaller in cross sectional area measured perpendicular to the propagation direction through said zone than that of said rear face, the element being responsive to those pressure or shock waves which propagate through said zone, said zone comprising a means for providing polar response signal outputs from said element, said outputs having the same signal polarity and do not have a zero value over said wide range of the angles of incidence.

7. A transducer assembly as claimed in claim 6 wherein said zone is a spigot extending from the rear face of said head.

8. A shock or pressure wave detecting transducer assembly for detecting air-borne shock or pressure waves generated on movement of a projectile therepast, said transducer comprising a head for receiving said shock or pressure waves and a transducer element mounted behind said head and connected with the rear face thereof;

said head and said transducer element being mounted by mounting means on a body which is used for fastening said transducer assembly to frame means characterized by;

said mounting means comprising means for enhancing isolation of frame borne shock or pressure waves from said head and permitting high stability of the position of mounting of said transducer assembly to said frame said enhancing means comprising a series path of acoustic mismatches between said head and said body, said path including at least four interfaces.

9. A transducer assembly as claimed in claim 8 wherein said four interfaces are defined by the junctions between said head and a first resilient mounting means, between said first resilient mounting means and a first body part, between said first body part and a second resilient mounting means, and between said second resilient mounting means and a second body part which is used to hold the transducer assembly to said frame.

10. A transducer assembly as claimed in claim 9 wherein said head and said body are circular in cross section and wherein said first and said second resilient means are annular rings.

11. A transducer assembly as claimed in claim 9 wherein said first body part is an elongate body part and wherein said head is at one end of said elongate body member and said first resilient means is at said one end, and wherein said second body part is positioned at said other end of said elongate body member and said second resilient means is at said other end.

12. A shock or pressure wave detecting transducer assembly for detecting air-borne shock or pressure waves on movement of a projectile therepast, said transducer comprising a head, said head having a front surface to receive shock or pressure waves received over a wide range of angles of incidence of up to approximately 80° with respect to a central axis of the transducer assembly and to transmit them to a point on the rear face thereof, a transducer element comprising a piezoelectric member connected with said rear face by a spigot which embraces said point, said spigot being substantially smaller in cross sectional area measured perpendicular to the direction of propagation of shock or pressure waves through said spigot than that of said rear face characterized by;

said piezo-electric element being mounted within an electrically conductive tube which has a partly closed end, said piezo-electric element being mounted at said partly closed end so that one face of said piezo-electric element electrically connects with said partly closed end and wherein said spigot connects with said one face of said piezo-electric element through an opening in said partly closed end whereby electrical connection to said one face can be obtained by taking a lead from the other end of said tube.

13. A transducer assembly as claimed in claim 12 wherein said head has a rearwardly extending tubular part into which said electrically conductive tube is received.

14. A transducer assembly as claimed in claim 12 wherein said piezo-electric element is held in said electrically conductive tube by a back-fill of resin and wherein an electrical lead electrically connected to the other face of said piezo-electric element passes through said back-fill of resin, whereby to anchor said electrical lead to said electrically conductive tube.

15. A shock or pressure wave detecting transducer assembly for detecting air-borne shock or pressure waves generated on movement of a projectile therepast, said transducer comprising, a head, said head having a front surface to receive shock or pressure waves received over a wide range of angles of incidence of up to approximately 80° with respect to a central axis of the transducer assembly and to transmit them to a point on the rear face, a transducer element mounted behind said head and connected with the rear face of the head by a zone which embraces said point, said zone being substantially smaller in cross sectional area measured perpendicular to the propagation direction through said zone than that of said rear face, the element being responsive to those pressure or shock waves which propagate through said zone, said zone comprising a means for providing polar response signal outputs from said element, said outputs having the same signal polarity and do not have a zero value over said wide range of the angles of incidence, said head and said transducer element being mounted by mounting means on a body which is used for fastening said transducer assembly to frame means characterized by;

said mounting means comprising means for enhancing isolation of frame borne shock or pressure waves from said head and permitting high stability of the position of mounting of said transducer assembly to said frame said enhancing means comprising a series path of acoustic mismatches between said head and said body, said path including at least four interfaces.

16. A transducer assembly as claimed in claim 15 wherein said four interfaces are defined by the junctions between said head and a first resilient mounting means, between said first resilient mounting means and a first body part, between said first body part and a second resilient mounting means, and between said second resilient mounting means and a second body part which is used to hold the transducer assembly to said frame.

17. A shock or pressure wave detecting transducer assembly as claimed in claim 15 wherein said zone is defined by a member which extends from said rear face of the head.

18. A transducer assembly as claimed in claim 15 wherein said zone is a spigot extending from the rear face of said head.

19. A shock or pressure wave detecting transducer assembly for detecting air-borne shock or pressure waves generated on movement of a projectile therepast, said transducer comprising, a head, said head having a front surface to receive shock or pressure waves received over a wide range of angles of incidence of up to approximately 80° with respect to a central axis of the transducer assembly and to transmit them to a point on the rear face, characterized by;

a piezoelectric transducer element mounted behind said head and connected with the rear face of the head by a zone which embraces said point, said zone being substantially smaller in cross sectional area measured perpendicular to the propagation direction through said zone than that of said rear face, the element being responsive to those pressure or shock waves which propagate through said zone, said zone comprising a means for providing polar response signal outputs from said element, said outputs having the same signal polarity and do not have a zero value over said wide range of the angles of incidence, characterized by said transducer element being mounted within an electrically conductive tube which has a partly closed end, said transducer element being mounted at said partly closed end so that said transducer element electrically connects with said partly closed end and wherein said zone connects with said one face of said piezo-electric element through an opening in said partly closed end whereby electrical connection to said one face can be obtained by taking a lead from the other end of said tube.

* * * * *